(12) United States Patent
Pang (10) Patent No.: US 7,906,386 B2
(45) Date of Patent: Mar. 15, 2011

(54) SEMICONDUCTOR DEVICE AND METHOD OF FABRICATING THE SAME

(75) Inventor: Sung-Man Pang, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 300 days.

(21) Appl. No.: 12/201,427

(22) Filed: Aug. 29, 2008

(65) Prior Publication Data

US 2009/0057770 A1    Mar. 5, 2009

(30) Foreign Application Priority Data

Sep. 4, 2007    (KR) .................. 10-2007-0089416

(51) Int. Cl.
*H01L 21/8238* (2006.01)

(52) U.S. Cl. .................. 438/199; 438/210; 257/E21.632

(58) Field of Classification Search .................. 438/92, 438/167, 169, 199, 200, 210, 270; 257/E21.632
See application file for complete search history.

(56) References Cited

U.S. PATENT DOCUMENTS

2005/0139753 A1 *  6/2005  Park et al. .................. 250/214.1
* cited by examiner Primary Examiner — Hoai v Pham
(74) Attorney, Agent, or Firm — Sherr & Vaughn, PLLC

(57) ABSTRACT

A semiconductor device capable of preventing malfunction of a Schottky diode to reduce a failure ratio of the semiconductor device and a method for fabricating the same are disclosed. The semiconductor device includes first and second CMOS switching devices formed over a silicon substrate, a Schottky diode formed in a Schottky diode region, and a Schottky diode isolation film surrounding the Schottky diode region and isolating the Schottky diode from the silicon substrate.

16 Claims, 9 Drawing Sheets

SEMICONDUCTOR DEVICE AND METHOD OF FABRICATING THE SAME

The present application claims priority under 35 U.S.C. 119 to Korean Patent Application No. 10-2007-0089416 (filed on Sep. 4, 2008), which is hereby incorporated by reference in its entirety.

BACKGROUND

In general, a Schottky diode is a device using a metal-semiconductor junction. The Schottky diode has excellent high-speed switching characteristics compared to a general PN junction diode. The reason is that when a forward voltage is applied to the Schottky diode, there is no RC delay caused by minority carrier injection (MCI) which may occur in the PN junction.

Generally, a diode should have low forward voltage drop characteristics and low leakage current characteristics to meet the trend toward high power and high speed operation. The Schottky diode strongly exhibits these characteristics compared to the PN junction diode.

The Schottky diode must improve reverse characteristics (e.g., reverse voltage and leakage current) to withstand high voltages and high temperatures. Also, the Schottky diode must enhance forward characteristics (turn-on resistance ($R_{on}$) characteristics) to be capable of rectifying high-density current. However, since there is a trade-off relationship between forward characteristics and reverse characteristics, careful engineering is required to take all characteristics in account.

Figure 1A:
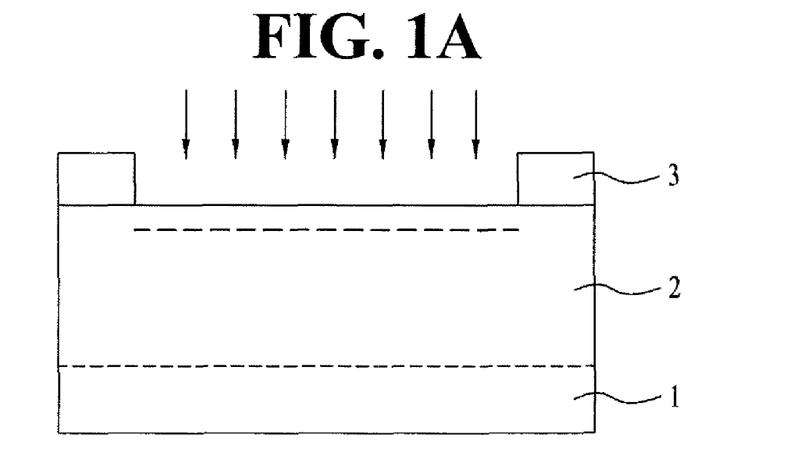
FIGS. 1A to 1F illustrate cross-sectional views showing the steps of a related method for fabricating a Schottky diode using a CMOS process.

FIGS. 1A to 1F illustrate cross-sectional views showing the steps of a related method for fabricating a Schottky diode using a CMOS process. As shown in FIG. 1A, a P-type oxide film 2 is grown over the surface of a P-type silicon substrate 1. Then, a first photoresist film 3 is deposited and patterned by a photolithography process to define an N-well formation region. Then, an ion implantation process for implanting N-type impurities is performed using high voltage and low voltage N-well masks.

Figure 1B:
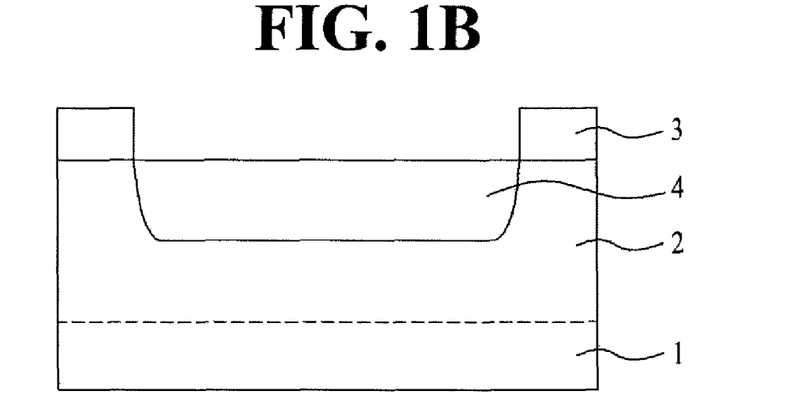

As shown in FIG. 1B, a diffusion process forms an N-type impurity diffusion region 4. When the density of high voltage N-well impurities is low, the breakdown voltage increases, but the forward conducting resistance also increases, thereby reducing the current carrying capacity.

Figure 1C:
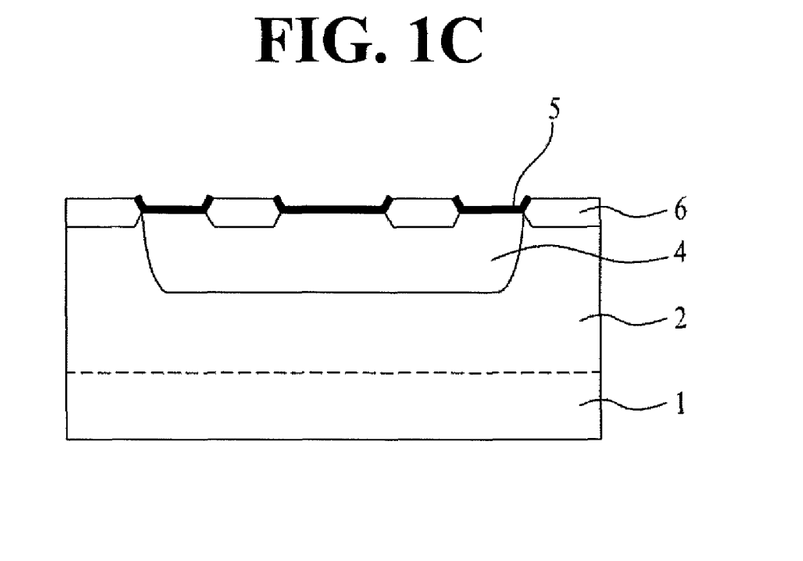

As shown in FIG. 1C, a pad oxide film or a pad nitride film 5 is formed over the entire surface of the P-type silicon substrate 1 including the N-type impurity diffusion region 4. Then, a shallow trench isolation (STI) process or a local oxidation of silicon (LOCOS) process forms a device isolation film 6. The device isolation film 6 may be formed of a silicon oxide film. For example, the P-type silicon substrate 1 with the pad nitride film 5 is patterned using a device isolation mask, and a photolithography process using an N-type field mask is performed. Then, boron (B) ions for edge termination are implanted at the edges of an active region of anode and cathode formation regions. A thermal oxidation process is performed to form the device isolation film 6. Then, the residual pad nitride film 5 may be removed.

Figure 1D:
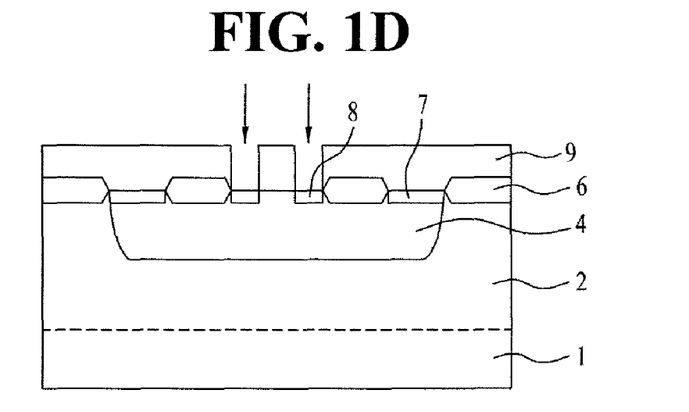

As shown in FIG. 1D, a second photoresist film is formed and patterned to expose a cathode formation region 7. Then, a lightly doped impurity region 7 or a lightly doped drain (LDD) is formed in the cathode formation region 7 using an N-type mask.

The second photoresist film is removed and a third photoresist film 9 is formed and patterned to expose an anode formation region 8. Then, a lightly doped impurity region 8 or a lightly doped drain (LDD) is formed in the anode formation region using a P-type mask. In other words, a photolithography process using N-type and P-type masks and an ion implantation process are performed to form an N-type junction 7 in the cathode formation region and a P-type junction 8 in the anode formation region. The N-type and P-type junctions 7 and 8 are formed to provide an ohmic contact.

Figure 1E:
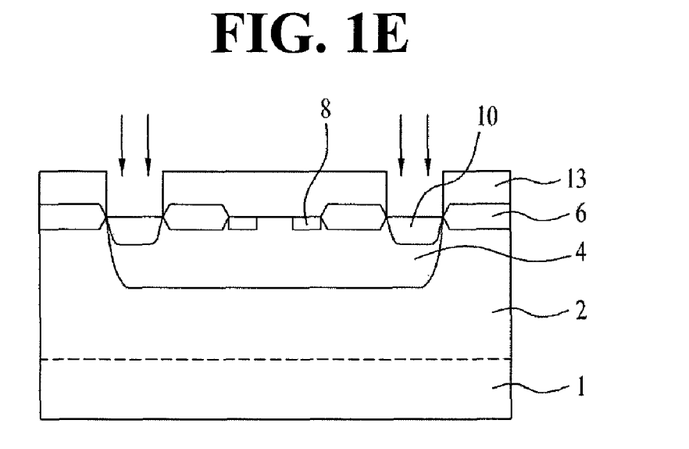

As shown in FIG. 1E, a fourth photoresist film 13 is formed and patterned to expose the cathode formation region. Further, an ion implantation process of N+ impurities is performed in the cathode formation region to form an N+ impurity diffusion region 10.

Figure 1F:
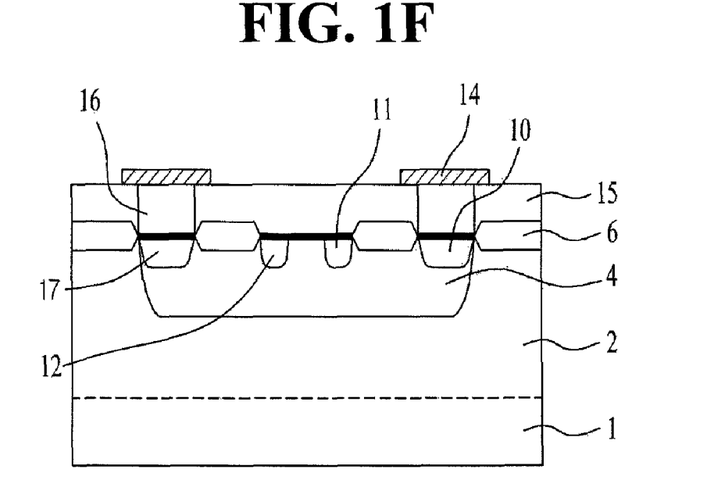

As shown in FIG. 1F, the fourth photoresist film 13 is removed and a fifth photoresist film is formed and patterned to expose the anode formation region. P+ impurities are implanted in the anode formation region to form a P+ impurity diffusion region 11 and 12. Then, an interlayer insulating film 15 is formed over the entire structure, and a photolithography process using a contact mask is performed to expose the cathode and anode formation regions.

A Ti film serving as Schottky barrier metal is deposited over the entire structure and rapid thermal treatment is performed to form a Ti silicide film 17 over the surface of the anode and cathode formation regions. A TiW film 16 serving as Schottky barrier metal is deposited, and an Al film 14 serving as interconnection metal is deposited thereon. A photolithography process using an electrode mask and an etching process are performed on the Al film 14 to define an anode electrode and a cathode electrode, and thermal treatment is performed on the Al film 14.

Figure 2:
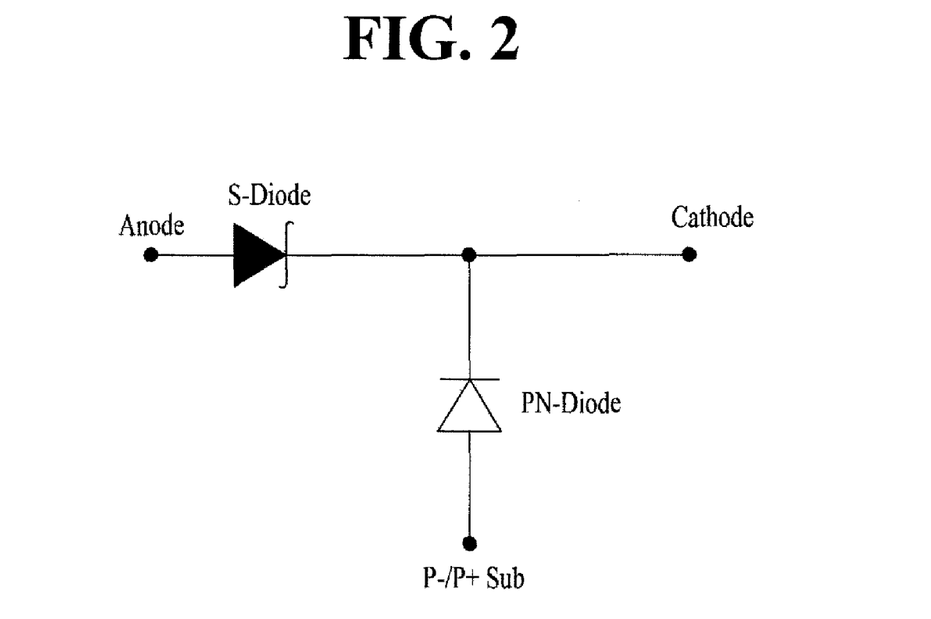
FIG. 2 illustrates an equivalent circuit diagram showing a related Schottky diode.

In the related Schottky diode described above, as shown in FIG. 2, there is a problem of forming a parasitic PN junction diode ("PN-Diode" in FIG. 2) by the N-type impurity diffusion region 4 formed over the P-type silicon substrate 1. Specifically, when a negative voltage or ground voltage is applied to the cathode of the Schottky diode ("S-Diode" in FIG. 2) while the P-type silicon substrate 1 having the Schottky diode is grounded, a parasitic PN junction diode is formed between the P-type silicon substrate 1 and the N-type impurity diffusion region 4. Accordingly, the related Schottky diode may malfunction in the circuit by the operation of the parasitic PN junction diode.

SUMMARY

Embodiments relate to a semiconductor device and a method for fabricating the same, and more particularly to a semiconductor device capable of preventing malfunction of a Schottky diode to reduce a failure ratio of the semiconductor device and a method for fabricating the same. Embodiments relate to a semiconductor device capable of preventing malfunction of a Schottky diode to reduce a failure ratio of the semiconductor device and a method for fabricating the same.

Embodiments relate to a semiconductor device which includes first and second CMOS switching devices formed over a silicon substrate, a Schottky diode formed in a Schottky diode region, and a Schottky diode isolation film surrounding the Schottky diode region and isolating the Schottky diode from the silicon substrate.

The Schottky diode isolation film may include an impurity isolation region surrounding a side surface of the Schottky diode region, and an impurity diffusion region surrounding a lower surface of the Schottky diode region. The Schottky diode isolation film may further include a silicide film formed over the impurity isolation region, and a connection terminal serving as a metal line formed over the silicide film. A ground voltage may be applied to the Schottky diode isolation film through the connection terminal and the silicide film.

Embodiments relate to a method for fabricating a semiconductor device which includes forming first and second CMOS switching devices over a silicon substrate, forming a Schottky diode isolation film to surround a Schottky diode region to isolate the Schottky diode from the silicon substrate, and forming a Schottky diode substantially simultaneously with forming the first and second CMOS switching devices.

Forming a Schottky diode isolation film may include forming an impurity diffusion region to surround a lower surface of the Schottky diode region, and forming an impurity isolation region to surround a side surface of the Schottky diode region. Forming a Schottky diode isolation film may further include forming a silicide film over the impurity isolation region, and forming a connection terminal, serving as a metal line, over the silicide film. Forming a Schottky diode isolation film may further include applying a ground voltage to the connection terminal and the silicide film.

DRAWINGS

Example

Example

DESCRIPTION

Hereinafter, a semiconductor device and a method for fabricating the semiconductor device according to embodiments will be described in detail with reference to the accompanying drawings. Example FIGS. 3A to 3Q illustrate cross-sectional views showing the semiconductor device and the method for fabricating the semiconductor device according to embodiments.

Figure 3A:
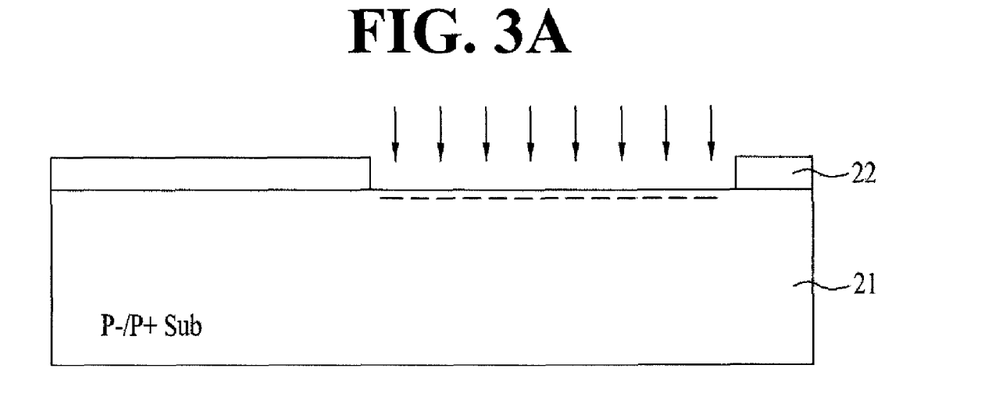
FIGS. 3A to 3Q illustrate cross-sectional views showing the steps of a method for fabricating a Schottky diode using a CMOS process according to embodiments.

In a Schottky diode shown in example FIG. 3A, an insulating film 22 or an oxide film may be formed over the surface of a P+ or P− type silicon substrate 21. Then, a first N-type impurity region may be defined using a patterning process, for example, a photolithography process. N-type impurities may be implanted in the first N-type impurity region using a first N-type mask for either low voltage or high voltage regions.

Figure 3B:
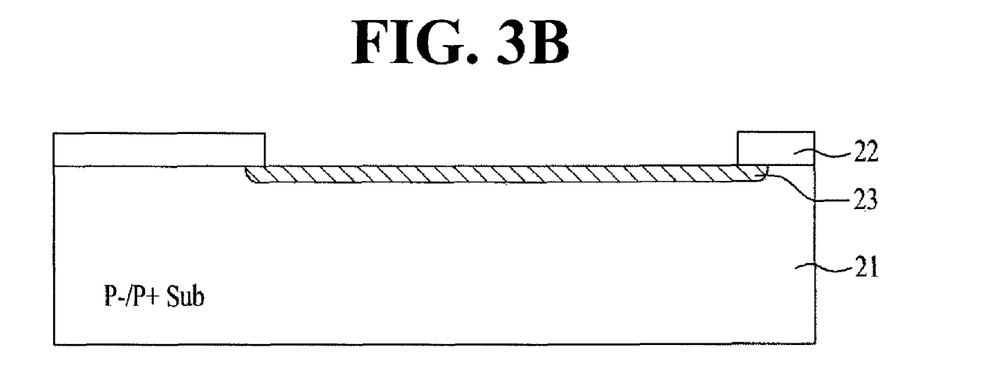

Then, as shown in example FIG. 3B, a diffusion process may be performed to form a first N-type impurity diffusion region 23. The first N-type impurity diffusion region 23 is formed to have a larger area than an area for forming the Schottky diode (hereinafter, an area for forming the Schottky diode will be called a Schottky diode region).

Figure 3C:
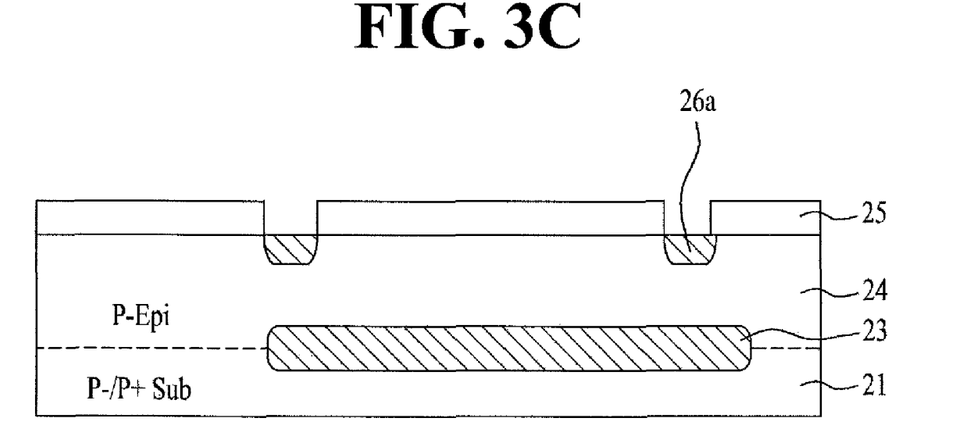

As shown in example FIG. 3C, a material equal or similar to the P-type silicon substrate 21, for example, a P-type oxide film, is grown over the entire surface of the P-type silicon substrate 21 including the first N-type impurity diffusion region 23 to thereby form a P-type epitaxial layer 24. The first N-type impurity diffusion region 23 may increase toward the P-type epitaxial layer 24.

A first photoresist film 25 may be deposited and patterned by a photolithography process to define a diode isolation region 26a. That is, a region surrounding a Schottky diode region is defined as the diode isolation region 26a and the first photoresist film 25 is patterned to expose the diode isolation region 26a. Then, N+ type impurities are implanted on the exposed diode isolation region 26a.

Figure 3D:
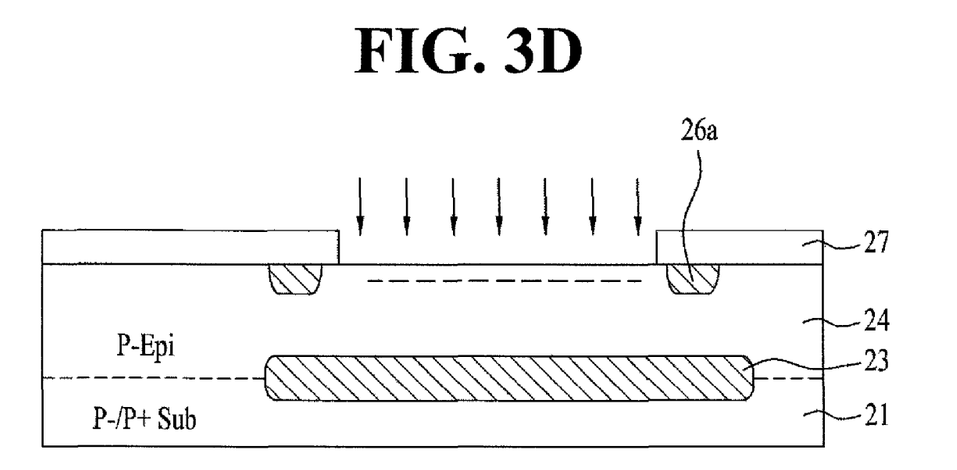

As shown in example FIG. 3D, a second photoresist film 27 may be deposited and patterned to define an N-well formation region. Then, N-type impurities may be implanted using high-voltage and low voltage N-well masks.

Figure 3E:
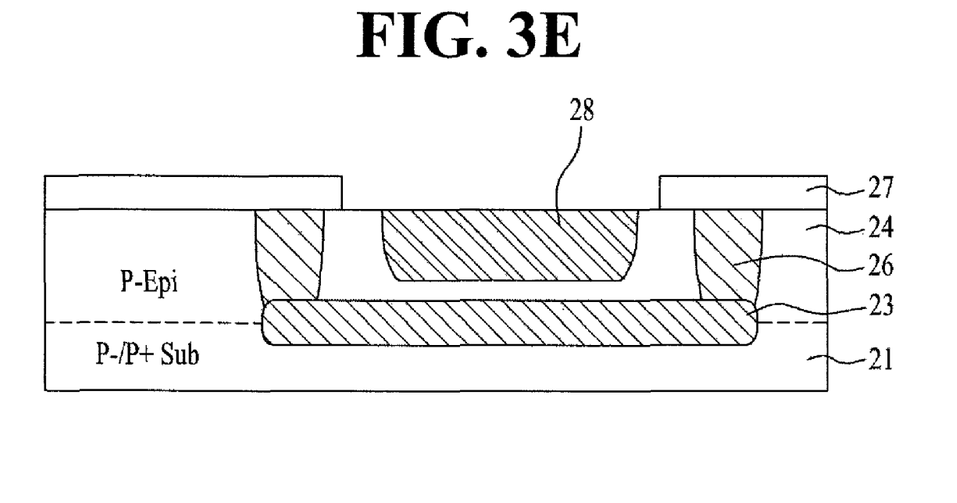

As shown in example FIG. 3E, a diffusion process may be used to form a second N-type impurity diffusion region 28 and also form an N+ impurity isolation region 26. The diffusion process may continue until N+ impurity ions of the N+ impurity isolation region 26 are connected to the first N-type impurity diffusion region 23. Accordingly, the N+ impurity isolation region 26 and the first N-type impurity diffusion region 23 may be formed to cover the periphery and the lower surface of the Schottky diode region. When the dopant density of high voltage N-well impurities is low, the breakdown voltage increases, but the forward conducting on-state resistance increases, thereby reducing the current capability.

Figure 3F:
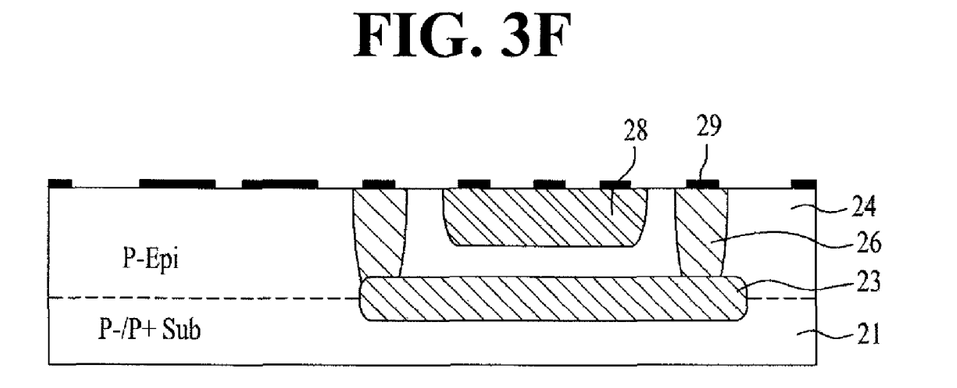

As shown in example FIG. 3F, a pad oxide film or a pad nitride film 29 may be formed over the entire surface of the P-type silicon substrate 21 and 24, including the second N-type impurity diffusion region 28 and the N+ impurity isolation region 26. The pad nitride film 29 may be patterned to expose a CMOS switching device, an anode formation region, a cathode formation region and a device isolation region of the Schottky diode.

Figure 3G:
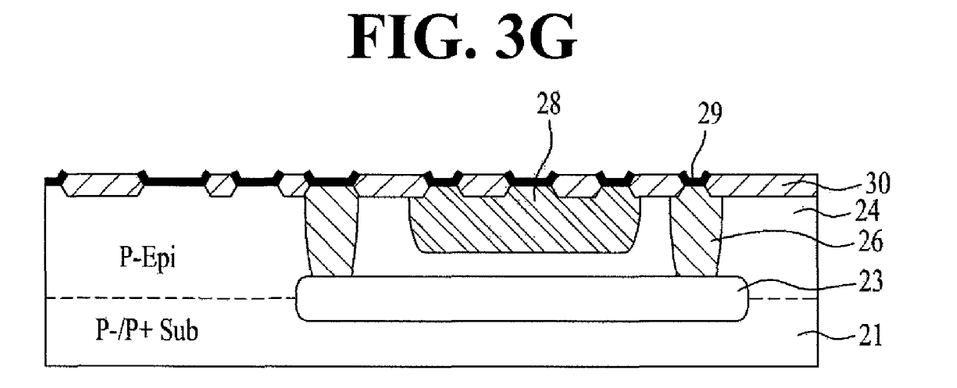

As shown in example FIG. 3G, a shallow trench isolation (STI) process or a local oxidation of silicon (LOCOS) process may be used to form a device isolation film 30. The device isolation film 30 may be formed of a silicon oxide film. For example, the P-type silicon substrate 21 and 24 with the pad nitride film 29 may be patterned using a device isolation mask, and a photolithography process using an N-type field mask may be performed. Then, boron (B) may be implanted at the edges of an active region of the anode and cathode formation regions for edge termination. A thermal oxidation process may be used to form the device isolation film 30. Then, the residual pad nitride film 29 may be removed.

Figure 3H:
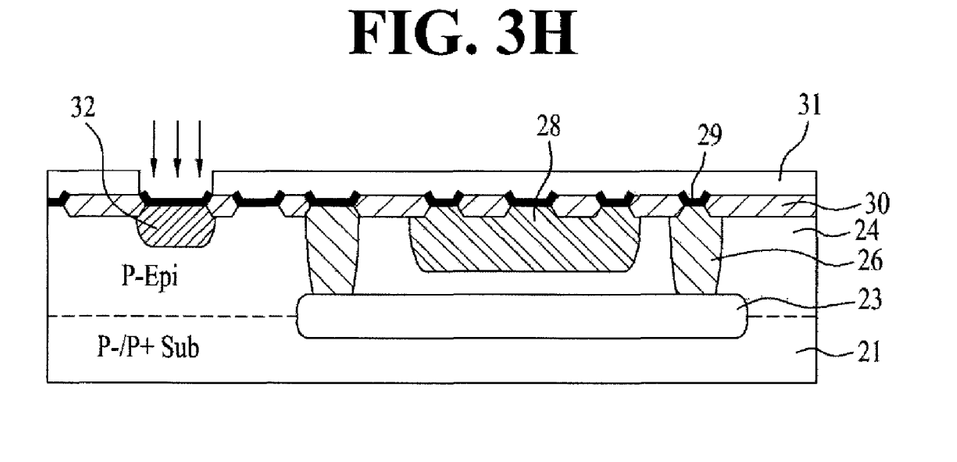

As shown in example FIG. 3H, a third photoresist film 31 may be formed and patterned to expose a first CMOS switching device formation region 32. Then, P-type impurities may be implanted using high voltage and low voltage P-well masks, and a diffusion process may be performed.

Figure 3I:
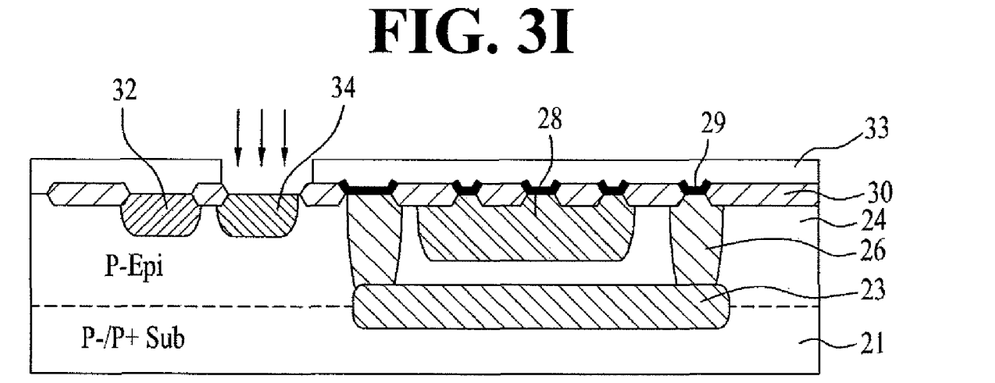

As shown in example FIG. 3I, a fourth photoresist film 33 may be formed and patterned to expose a second CMOS switching device formation region 34. Then, N-type impurities may be implanted using high voltage and low voltage N-well masks, and a diffusion process may be performed.

Figure 3J:
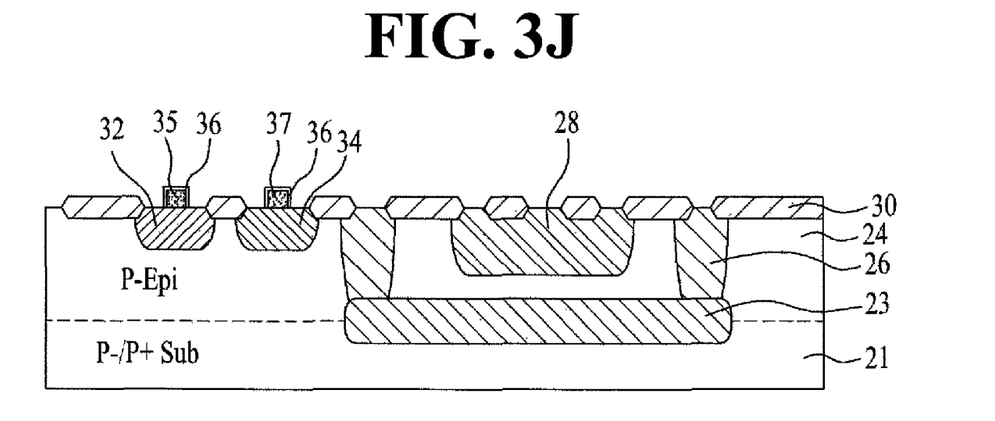

As shown in example FIG. 3J, the fourth photoresist film 33 may be removed, and gate insulating films may be formed over the first and second CMOS switching device formation regions 32 and 34. Then, a polysilicon layer may be formed over the P-type silicon substrate 21 and 24 including the gate insulating films, and the polysilicon layer and the gate insulating films may be selectively patterned by a photolithography process to form first and second gate electrodes 35 and 37. The first gate electrode 35 and the second gate electrode 37 may be formed separately. That is, the first gate electrode 35 may be formed first and then, the second gate electrode 37 may be formed. Then, a thermal oxidation process may be performed on the P-type silicon substrate 21 and 24 at a temperature of 800° C.~1200° C., thereby simultaneously forming both a gate oxide film 36, that is, the gate oxide film 36 and a coupling oxide film, over the surface of the P-type silicon substrate 21 and 24 including the first and second gate electrodes 35 and 37. In embodiments, the gate oxide film 36 may have a thickness of approximately 30 Å~80 Å, but the gate oxide film 36 may also be formed to have a thickness of approximately 30 Å~120 Å by controlling the temperature and time of the thermal oxidation process.

Figure 3K:
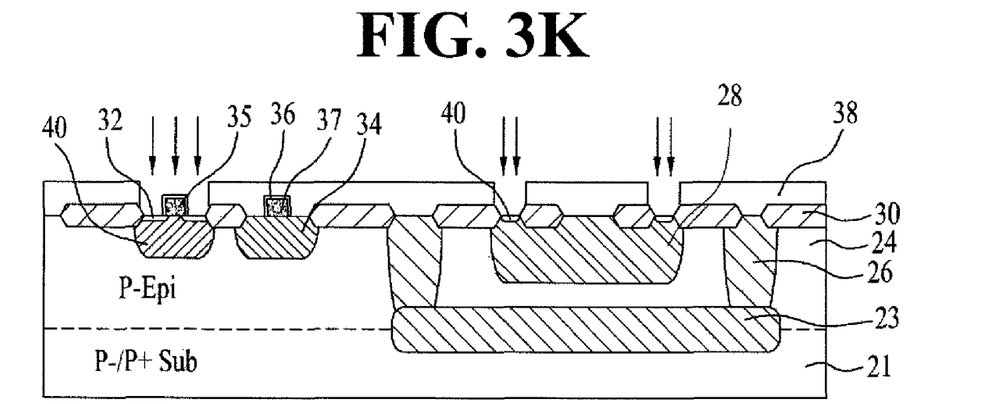

Then, as shown in example FIG. 3K, a fifth photoresist film 38 may be formed and patterned to expose the first CMOS switching device formation region 32 including the first gate electrode 35 and the cathode formation region of the Schottky diode. Then, low density impurity ions may be implanted into the low voltage region using the fifth photoresist film 38 as a mask. Accordingly, a lightly doped impurity region or a first lightly doped drain (LDD) 40 may be formed in the first CMOS switching device formation region 32 at opposite sides of the first gate electrode 35 and in the cathode formation region.

Figure 3L:
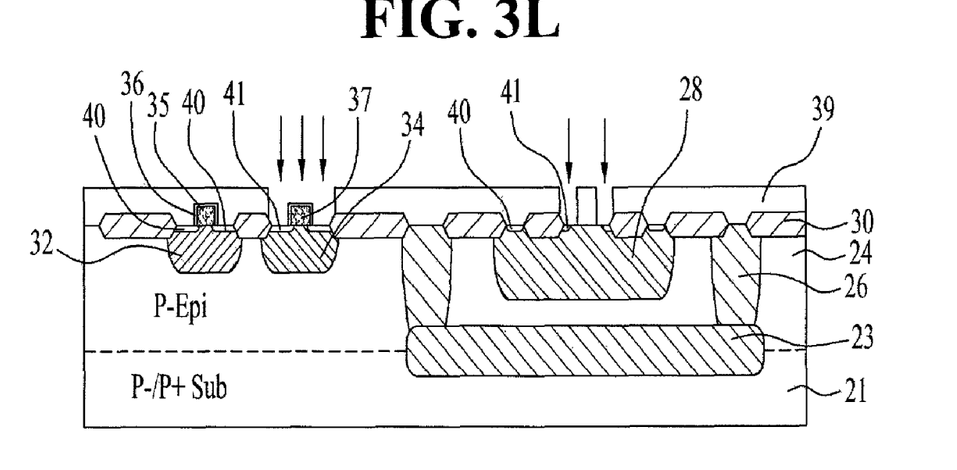

Then, as shown in example FIG. 3L, a sixth photoresist film 39 may be formed and patterned to expose the second CMOS switching device formation region 34 including the second gate electrode 37 and the anode formation region of the Schottky diode. Then, low density impurity ions may be implanted into the low voltage region using the sixth photoresist film 39 as a mask. Accordingly, a lightly doped impurity region or a second lightly doped drain 41 may be formed in the second CMOS switching device formation region 34 at opposite sides of the second gate electrode 37 and the anode formation region. In other words, a photolithography process using N-type and P-type masks and an ion implantation process may be performed to form an N-type junction 40 in the cathode formation region and a P-type junction 41 in the anode formation region. N-type and P-type junctions 40 and 41 may be formed to provide an ohmic contact.

Figure 3M:
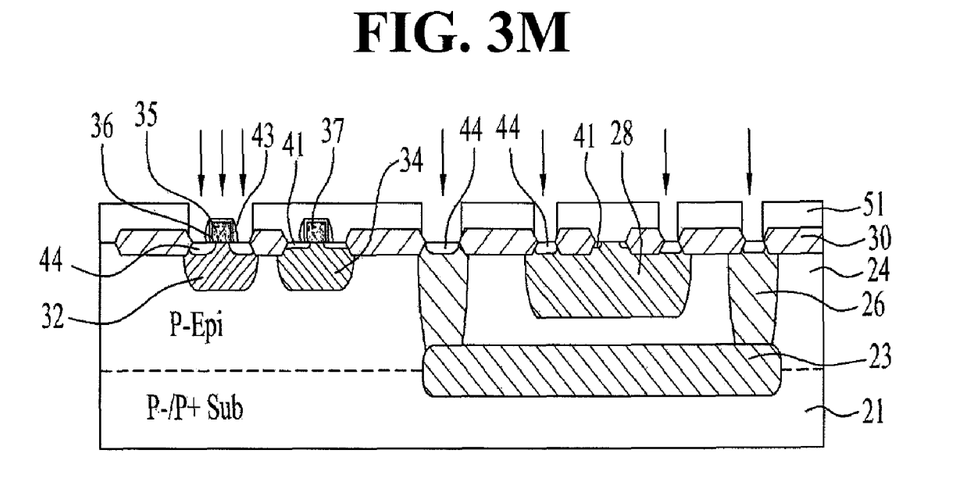

As shown in example FIG. 3M, an insulating film may be deposited over the entire surface of the P-type silicon substrate 21 and 24, and an etch back process may be performed on the entire surface thereof to form insulating sidewalls 43 over the opposite surfaces of the first and second gate electrodes 35 and 37.

Thereafter, a seventh photoresist film 51 may be formed and patterned to expose the cathode formation region, the diode isolation region 26 and the first CMOS switching device formation region 32. N+ impurities may be implanted on the cathode formation region, the diode isolation region 26 and the first CMOS switching device formation region 32, thereby forming an N+ impurity diffusion region 44.

Figure 3N:
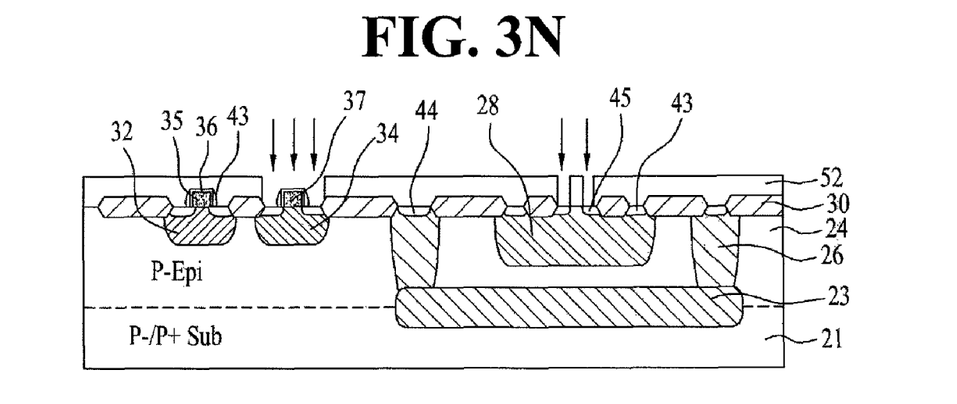

As shown in example FIG. 3N, an eighth photoresist film 52 may be formed and patterned to expose the anode formation region and the second CMOS switching device formation region 34. P+ impurities may be implanted on the anode formation region and the second CMOS switching device formation region 34, thereby forming a P+ impurity diffusion region 45.

Figure 3O:
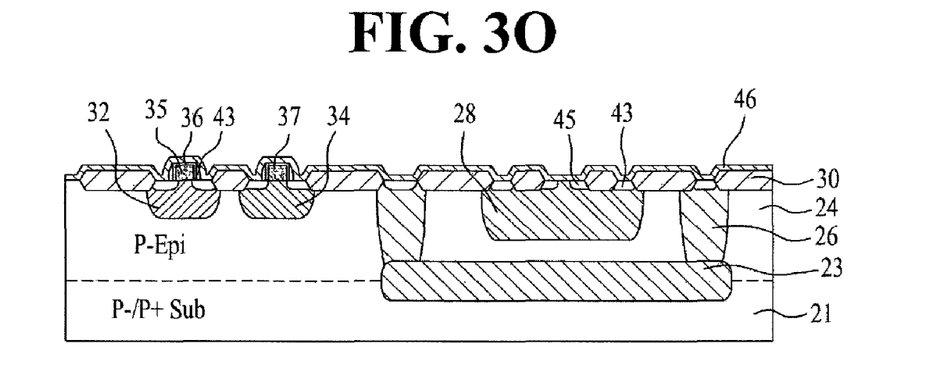

As shown in example FIG. 3O, a Ti film serving as Schottky barrier metal may be deposited over the entire structure and rapid thermal treatment is performed to form a Ti silicide film 46 over the surface of the anode and cathode formation regions.

Figure 3P:
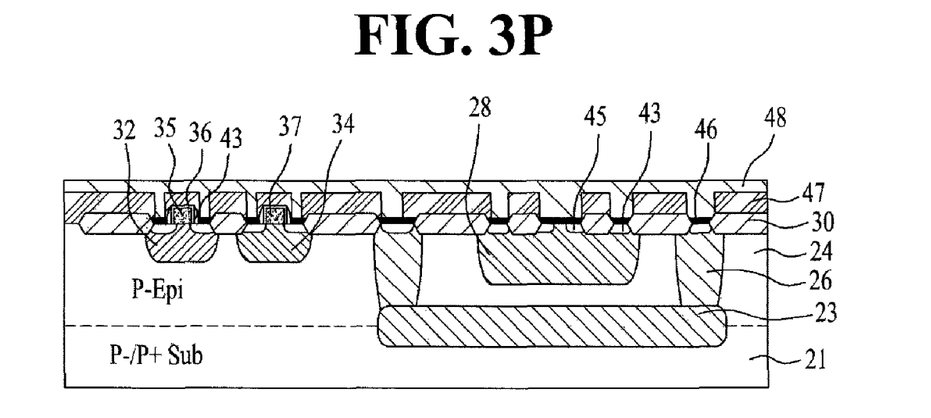
Figure 3Q:
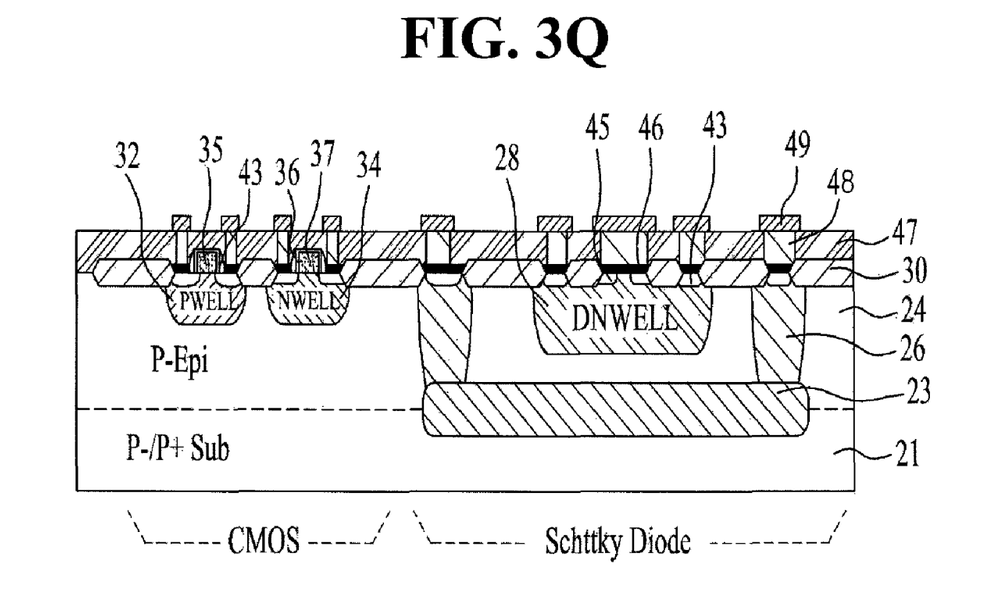

As shown in example FIG. 3P, a TiW film 47 serving as Schottky barrier metal may be deposited and patterned. An Al film 48 serving as interconnection metal may be deposited thereon, and a photolithography process using an electrode mask and an etching process may be performed to define an anode electrode and a cathode electrode. Then, thermal treatment may be performed on the Al film 48. Afterwards, a ground voltage may be applied to an Al terminal, i.e., a connection terminal 49, of the isolation film 23 and 26 for isolating the Schottky diode from the P-type silicon substrate 21 and 24.

As described above, in the semiconductor device and the method for fabricating the same according to embodiments, when the CMOS switching devices are formed, the Schottky diode and the isolation film 23 and 26 for isolating the Schottky diode from the P-type silicon substrate 21 and 24 may be formed. Further, a ground voltage may be applied to the Schottky diode isolation film 23 and 26, thereby preventing the malfunction of the Schottky diode.

Figure 4:
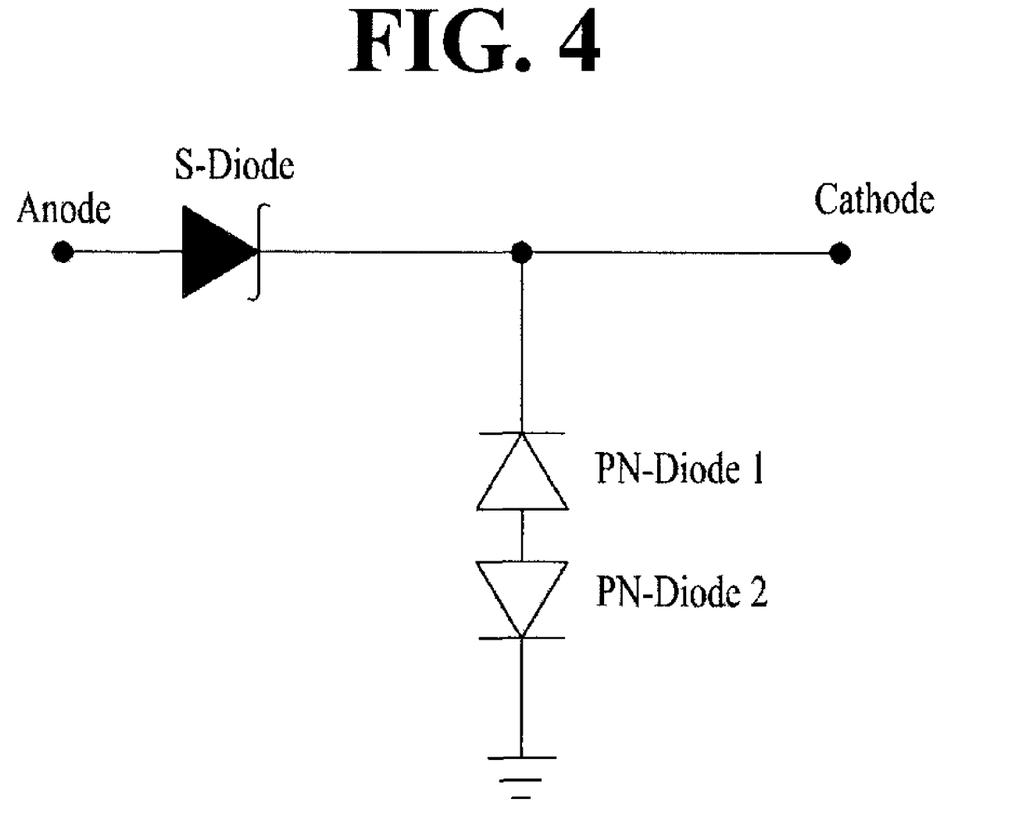
FIG. 4 illustrates an equivalent circuit diagram showing a Schottky diode according to embodiments.

Specifically, as shown in example FIG. 4, the Schottky diode isolation film 23 and 26 is formed such that a parasitic PN junction diode (PN-Diode1 in example FIG. 4), which is formed by the N-type impurity diffusion region 28 formed over the P-type silicon substrate 21 and 24, does not operate. That is, a parasitic PN junction diode, PN-Diode2, is formed opposite to the parasitic PN junction diode, PN-Diode1, thereby preventing the operation of PN-Diode1.

In the semiconductor device and the method for fabricating the same according to embodiments, when the CMOS switching devices are formed, the Schottky diode and the isolation film for isolating the Schottky diode from the P-type silicon substrate are formed. That is, a parasitic PN junction diode is formed opposite to a parasitic PN junction diode, thereby preventing the operation of the parasitic PN junction diode. Further, a ground voltage is applied to the Schottky diode isolation film, thereby preventing malfunction of the Schottky diode.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming first and second CMOS switching devices over a silicon substrate;
   forming a Schottky diode isolation film to surround a Schottky diode region to isolate the Schottky diode from the silicon substrate; and
   forming a Schottky diode substantially simultaneously with said forming the first and second CMOS switching devices.

2. The method of claim 1, wherein said forming the Schottky diode isolation film includes:
   forming an impurity diffusion region to surround a lower surface of the Schottky diode region; and
   forming an impurity isolation region to surround a side surface of the Schottky diode region.

3. The method of claim 2, wherein the step of forming a Schottky diode isolation film further includes:
   forming a silicide film over the impurity isolation region; and
   forming a connection terminal, serving as a metal line, over the silicide film.

4. The method of claim 3, wherein the step of forming a Schottky diode isolation film further includes applying a ground voltage to the connection terminal and the silicide film.

5. The method of claim 3, wherein a Schottky barrier metal is deposited over the silicide film and patterned.

6. The method of claim 5, wherein the Schottky barrier metal is a TiW film.

7. The method of claim 3, wherein the connection terminal is formed from aluminum.

8. The method of claim 2, wherein the impurity diffusion region is formed to be larger than the Schottky diode region.

9. The method of claim 2, wherein the impurity isolation region is connected to the impurity diffusion region.

10. The method of claim 2, wherein a first and a second parasitic diode are formed in the Schottky diode region.

11. The method of claim 10, wherein the first and second parasitic diodes are oriented opposite each other.

12. The method of claim 11, wherein the first parasitic diode prevents operation of the second parasitic diode, and the second parasitic diode prevents operation of the first parasitic diode.

13. The method of claim 1, wherein a single ion implantation process forms a lightly doped impurity region in the first CMOS switching device at opposite sides of a first gate electrode and a first lightly doped drain in a cathode formation region of the Schottky diode.

14. The method of claim 13, wherein a single ion implantation process forms a lightly doped drain region in the second CMOS switching device at opposite sides of a second gate electrode and a first lightly doped impurity in an anode formation region of the Schottky diode.

15. The method of claim 1, wherein a shallow trench isolation process is used to form the Schottky diode isolation film.

16. The method of claim 1, wherein a local oxidation of silicon process is used to form the Schottky diode isolation film.

* * * * *